(12) United States Patent
Wainreb et al.

(10) Patent No.: US 10,302,414 B2
(45) Date of Patent: May 28, 2019

(54) SCATTEROMETRY METHOD AND SYSTEM

(71) Applicants: Nova Measuring Instruments Ltd., Rehovot (IL); GLOBAL FOUNDRIES, Malta, NY (US)

(72) Inventors: Gilad Wainreb, Tel Aviv (IL); Etai Littwin, Yavne (IL); Alok Vaid, Ballston Lake, NY (US); Michael Klots, Givatayim (IL); Cornel Bozdog, San Jose, CA (US); Matthew Sendelbach, Fishkill, NY (US)

(73) Assignees: NOVA MEASURING INSTRUMENTS LTD., Rehovot (IL); GLOBALFOUNDRIES INC., Grand Cayman (KY)

( * ) Notice: Subject to any disclaimer, the term of this patent is extended or adjusted under 35 U.S.C. 154(b) by 423 days.

(21) Appl. No.: 14/852,897

(22) Filed: Sep. 14, 2015

(65) Prior Publication Data
US 2016/0076876 A1 Mar. 17, 2016

Related U.S. Application Data

(60) Provisional application No. 62/050,146, filed on Sep. 14, 2014.

(51) Int. Cl.
*G01B 11/06* (2006.01)
*G03F 7/20* (2006.01)

(52) U.S. Cl.
CPC .......... *G01B 11/06* (2013.01); *G03F 7/705* (2013.01); *G03F 7/70625* (2013.01); *G01B 2210/56* (2013.01)

(58) Field of Classification Search
None
See application file for complete search history.

(56) References Cited

U.S. PATENT DOCUMENTS

| 9,412,673 B2 * | 8/2016 | Kim ................... G03F 7/70616 |
| 2006/0009872 A1 | 1/2006 | Prager et al. |
| 2008/0007738 A1 | 1/2008 | Chard et al. |

(Continued)

OTHER PUBLICATIONS

International Search Report dated Jan. 17, 2016 in corresponding PCT application No. PCT/IL2015/000042.

(Continued)

*Primary Examiner* — Robert K Carpenter
(74) *Attorney, Agent, or Firm* — Daniel J. Swirsky; AlphaPatent Associates Ltd.

(57) ABSTRACT

A method and system are presented for use in model-based optical measurements in patterned structures. The method comprises: selecting an optimal optical model for interpretation of optical measured data indicative of optical response of the structure under measurements. The selection of the optimal optical model comprises: creating a complete optical model with floating parameters defining multiple configurations of said complete model including one or more model configurations describing an optical response of the structure under measurements, utilizing the complete model for predicting a reference optical response from the structure and generating corresponding virtual reference data, and using the virtual reference data for selecting the optimal optical model for interpretation of the optical measured data.

8 Claims, 3 Drawing Sheets

(56) References Cited

U.S. PATENT DOCUMENTS

2012/0123748 A1   5/2012   Aben et al.
2013/0124141 A1   5/2013   Brill et al.
2013/0282343 A1   10/2013  Brill et al.
2014/0142869 A1   5/2014   Cohen et al.
2014/0195194 A1   7/2014   Brill et al.

OTHER PUBLICATIONS

Sendelbach, M., et. al., "Impact of shrinking measurement error budgets on qualification metrology sampling and cost" in Metrology, Inspection, and Process Control for Microlithography XXVIII Proceedings of SPIE vol. 9050 ( 2014).

\* cited by examiner (GENERAL ART)

SCATTEROMETRY METHOD AND SYSTEM

TECHNOLOGICAL FIELD AND BACKGROUND

The present invention is generally in the field of measurement techniques, and relates to a method and system for model-based analysis of measured data. The invention is particularly useful for metrology systems for interpreting scatterometry measurements in patterned structures, such as semiconductor wafers.

Advanced processes and integration schemes (such as those utilizing multi-patterning and FinFET technologies) require precise detection and control of intricate profile parameters on a complex structures such as the sidewall angle, spacer widths, spacer pull-down, epitaxial proximity, footing/undercut, overfill/underfill parameters, etc. Scatterometry is known as the primary non-destructive method to address such detailed requirements for in-line profile metrology. Optical Critical Dimension (also termed "optical CD" or "OCD") measurement techniques (known also as Scatterometry) are known as efficient techniques for measuring parameters of patterned (periodic) structures. Measurement of these parameters provides a viable metrology solution for process control in high volume manufacturing of semiconductor devices.

Scatterometry is a model-based technique for optical critical dimension measurements (also termed "optical CD" or "OCD") in patterned structures enabling real-time monitoring of a patterning process. OCD measurements are usually performed using a fitting procedure. According to this procedure, theoretical model describing a structure under measurements is used to generate theoretical data or reference data, and the latter is iteratively compared to measured data, while varying the model parameters until the "best fit" is found. The parameters of the "best fit" model are considered as corresponding to the measured parameters. Measured data (typically optical data) can be analyzed to derive information regarding the geometrical parameters of patterns including thicknesses, critical dimension (CD), line spacing, line width, wall depth, wall profile, etc., as well as optical constants of materials included in a sample being measured.

Various model-based techniques have been developed for interpretation of the measured data. Such techniques are described for example in the following patent publications US2013124141, US2013282343, US2014195194, US2014142869, all assigned to the assignee of the present application.

GENERAL DESCRIPTION

There is a need in the art for a novel approach for use in model-based measurement techniques. This is associated with the fact that results of the model-based data analysis are strongly dependent on the selected model, and therefore model selection is an important factor affecting the measurement results.

As described above, in model-based measurement techniques, such as scatterometry, measured data is analysed/interpreted by calculation of optical response from a geometrical/optical model (i.e. theoretical data), fitting a measured optical signal (measured data) to the theoretical data, and extracting the most probable profile from the best fit condition.

This process is schematically exemplified in FIG. 1. As shown, measured spectral date, which in the present example corresponds to polarization based measurements and includes spectral responses for TE and TM polarization components, is compared to theoretical spectral data calculated using selected model or models and stored in the system library. The theoretical spectral data corresponding to the close match with the measured data is then used for extracting the pattern profile.

Scatterometry results depend on the details of the model selected during solution development, which in the simple example of FIG. 1 is a trapeze model. Such model might not reflect accurately enough the true profile measured, and a two-trapeze model might be more suitable. Different model parameterization as well as different optical modes used could also result in different scatterometry results.

In order to mitigate the risk of using an imperfect model (with the wrong details and degrees of freedom, possibly leading to inaccuracies or instability in reported results), best industry practice is to qualify scatterometry models prior to in-line implementation at each process step against different possible process modifications using costly and time-consuming, e.g. using cross-sectional imaging as reference which may be destructive. This practice is not only expensive for the user, but also delays scatterometry solutions from being deployed and used immediately at the onset of process development. With more complex processes and shrinking dimensions on advanced nodes, scatterometry tools and modeling methodologies are becoming more complex (more optical channels, multi-angle modes, more wavelengths ranges, feed forward, hybrid, etc.) leading to more permutations of the original model. This is causing even further delays in scatterometry time-to-solution due to higher modeling complexity as well as requirement of higher number of reference data points to be able to determine the best solution statistically (See Sendelbach, M., et. al. "Impact of shrinking measurement error budgets on qualification metrology sampling and cost" in *Metrology, Inspection and Process Control for Microlithiography XXVIII*, edited by Jason P. Cain, Proceedings of SPIE Vol. 9050 (SPIE, Bellingham, Wash. 2014) 90501M).

If reference data is available then the right model can be easily selected using statistical tools such as Total Measurement Uncertainty (TMU). Nevertheless, acquiring reference data is time and cost demanding, or not available, delayed or inaccurate.

Therefore, there is a need in the art for a technique enabling to select the right (optimal) model without any or with a reduced set of reference data, somehow through intrinsic scatterometry means.

The present invention provides a method and system capable of eliminating (or at least significantly reducing) the need for reference metrology for scatterometry setup (optimal model selection). The invention provides a novel methodology whereby the results that a reference system would provide are predicted directly from the measured optical data (e.g. scatterometry spectral data). The predicted virtual reference is then used as aid for selection of the right model in the same way a "real" reference would be used via TMU analysis.

The technique of the present invention recognizes that the information about the patterned structure being measured (e.g. measured spectra) is already encoded optically in the measured data (e.g. measured spectra). The method of the invention also assumes that, among other possible structures, the flexibility of the geometrical model provides that it includes also the model configuration (set of parameters) describing (corresponding to) the "real" structure. Using a prediction algorithm, the method predicts the response of a reference system (e.g. cross-sectional SEM) that would measure the "real" structure by examining different aspects of the flexible model and its relationship to the theoretical and measured optical response.

It should be understood that the parameters of the model include at least some (or even all) of the parameters of the patterned structure. These may include at least some of the following CD, top CD, bottom CD, sidewall angle, spacer widths, spacer pull-down, epitaxial proximity, footing/undercut, overfill/underfill parameters, rounding, etc. Usually, not all of the model parameters are parameters of interest (i.e. target parameters).

The method and algorithm herein are general in nature, and not restricted to any particular geometry, model or application. The algorithm adapts automatically adapted to the specifics of the spectral, data, model and geometry, and predicts the response (virtual reference) of a reference metrology regardless of the specific details of the application.

According to one broad aspect of the invention, there is provided a method for use in model-based optical measurements in patterned structures, the method comprising: selecting an optimal optical model for interpretation of measured data indicative of optical response of the structure under measurements, said selecting of the optical model comprising creating a complete model with floating parameters defining multiple configurations of said complete model including one or more model configurations describing an optical response of the structure under measurements, utilizing the complete model for predicting a reference optical response from the structure and generating corresponding virtual reference data, and using the virtual reference data for selecting the optimal optical model for interpretation of the optical measured data.

The selection of the optimal optical model using the predicted (virtual) reference response may be done with or without recourse to the TMU analysis framework.

The complete optical model includes most (or even all) parameters describing the structure which are floating parameters. The configuration (modification) of the complete optical model is created by fixing the value of one or more of the model parameters.

In some embodiments, the creation of the virtual reference data comprises:

utilizing apriori knowledge of the structure under measurements and preliminary measured data and creating said complete optical model;

utilizing the apriori knowledge of the structure and generating a set of theoretical optical responses (e.g. spectra) corresponding to different known configurations of said complete optical model; and interpreting the set of the theoretical optical responses by using a set of different configurations of said complete optical model, thereby defining a set of partial models, combining the set of partial models and creating a reference predictor; and applying said reference predictor to the optical measured data and determining said virtual reference data.

The creation of the reference predictor may comprise interpreting each element in said set of the theoretical optical responses corresponding to known "real" geometries) by each of said set of the partial models; selecting a combination of the partial models that best interpret the set of the theoretical optical responses according to predetermined criteria for goodness of interpretation; and utilizing the selected combination of the partial models to create the reference predictor (e.g. using at least one statistical tool).

According to another broad aspect of the invention, there is provided a system for use in model-based optical measurements in patterned structures, the system comprising: data input utility for receiving data indicative of preliminary measured data on the structure; a processor utility comprising a reference predictor module adapted for utilizing said data indicative of the preliminary measured data and input data about the structure and creating virtual reference data indicative of a virtual optical response of the structure and a verification module for verifying the optical measured data with respect to the virtual reference data, and defining the optimal optical model for interpretation of the optical measured data.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

Figure 1:
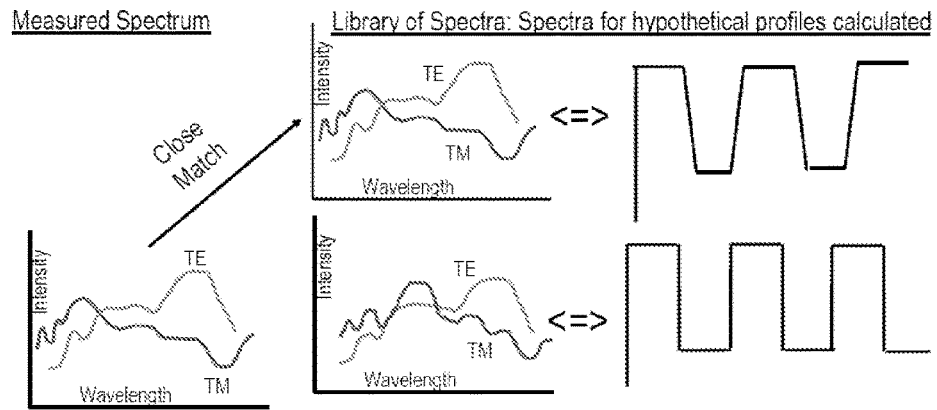
FIG. 1 is a schematic presentation of the conventional approach for model-based scatterometry measurements.

FIG. 1 illustrates the principles of conventional approach for model-based scatterometry measurements, according to which a model for measured data interpretation is selected using real reference data, namely data supplied by a reference measurement system/tool.

Figure 2:
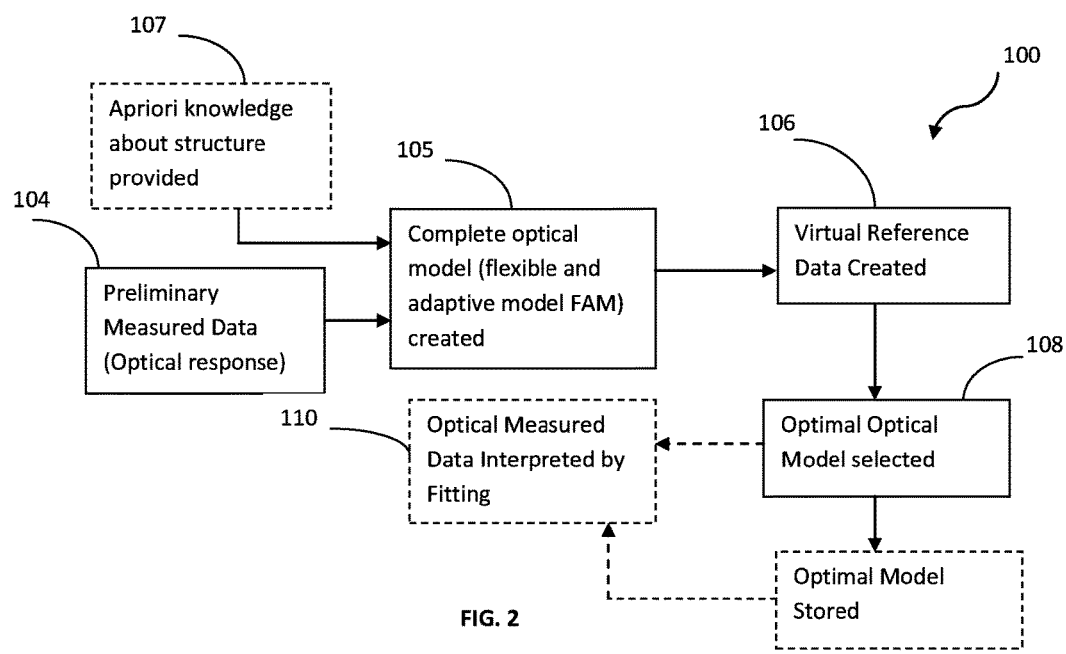
FIG. 2 is a flow chart exemplifying a method of the invention for using virtual reference data for model selection.

The present invention provides a novel method and system for determining and using virtual reference data in order to select an optimal theoretical geometrical/optical model for interpretation of real measured data. Reference is made to FIG. 2 exemplifying a flow chart 100 of a method according to the invention for use in metrology measurements on patterned structures.

As shown, input data including preliminary measured data (optical response, e.g. spectral response) is provided (step 104). Preferably, also provided is apriori knowledge of the structure under measurements (e.g. pattern parameter(s) of the structure)—step 107.

The preliminary measured data (and possible also the structure-related data) is processed, and a complete model with floating parameters is created (step 105). The complete model is a flexible and adaptive model (FAM), i.e. configurable model, enabling various configurations/modifications of the model (by fixing one or more model parameters), including one or meter of the model configurations describing an optical response of the structure under measurements.

The complete model is utilized (analyzed/processed) for predicting a reference optical response from the structure and corresponding virtual reference data is generated (step 106). This data presents "virtual reference", and is then used for scatterometry model setup (instead of "real" reference data typically obtained using preliminary measurements with a reference tool) for selection/optimisation of an optical model (step 108), which may be stored, and can be used in the calculation and fitting procedure applied to the actual measured data (step 110).

The inventors have evaluated the above method by comparing the performance of recipe developed solely based on the virtual reference (no real reference) to that using real reference. The method was qualified on several key applications from the 20 nm and 14 nm node (in the area of FinFET epitaxy and deposition, on 2D and 3D structures).

Table 1 compares the results for several evaluated test applications versus reference data. More specifically, Table 1 compares the performance of the reference predictor's estimated values with solution developed using "real" reference data from third party toolsets. Both solutions are compared against "real" reference. As can be seen, the estimated reference predictor reached a high accuracy compared with the reference data.

TABLE 1

| Application | Target parameter | Reference predictor's Estimated reference | | Solution developed using Real Reference data | |
|---|---|---|---|---|---|
| | | $R^2$ | Slope | $R^2$ | Slope |
| 14 nm FinFET spacer deposition | Spacer width | 0.91 | 0.92 | 0.95 | 0.98 |
| 20 nm sigma cavity etch | Tip height | 0.94 | 0.92 | 0.9 | 0.97 |
| | Tip CD | 0.96 | 0.89 | 0.98 | 0.97 |
| | Flat CD | 0.96 | 0.95 | 0.96 | 0.95 |
| 14 nm FinFET epitaxial growth | Epi height | 0.85 | 0.99 | 0.91 | 0.97 |

The inventors have found that the performance of the solution developed using the virtual reference based technique of the invention is similar to the performance of solution obtained using real reference data. In some cases, the performance of the virtual reference based technique is even slightly better. This could be associated with residual modeling imperfections and/or fluctuations in the real reference data.

Figure 3:
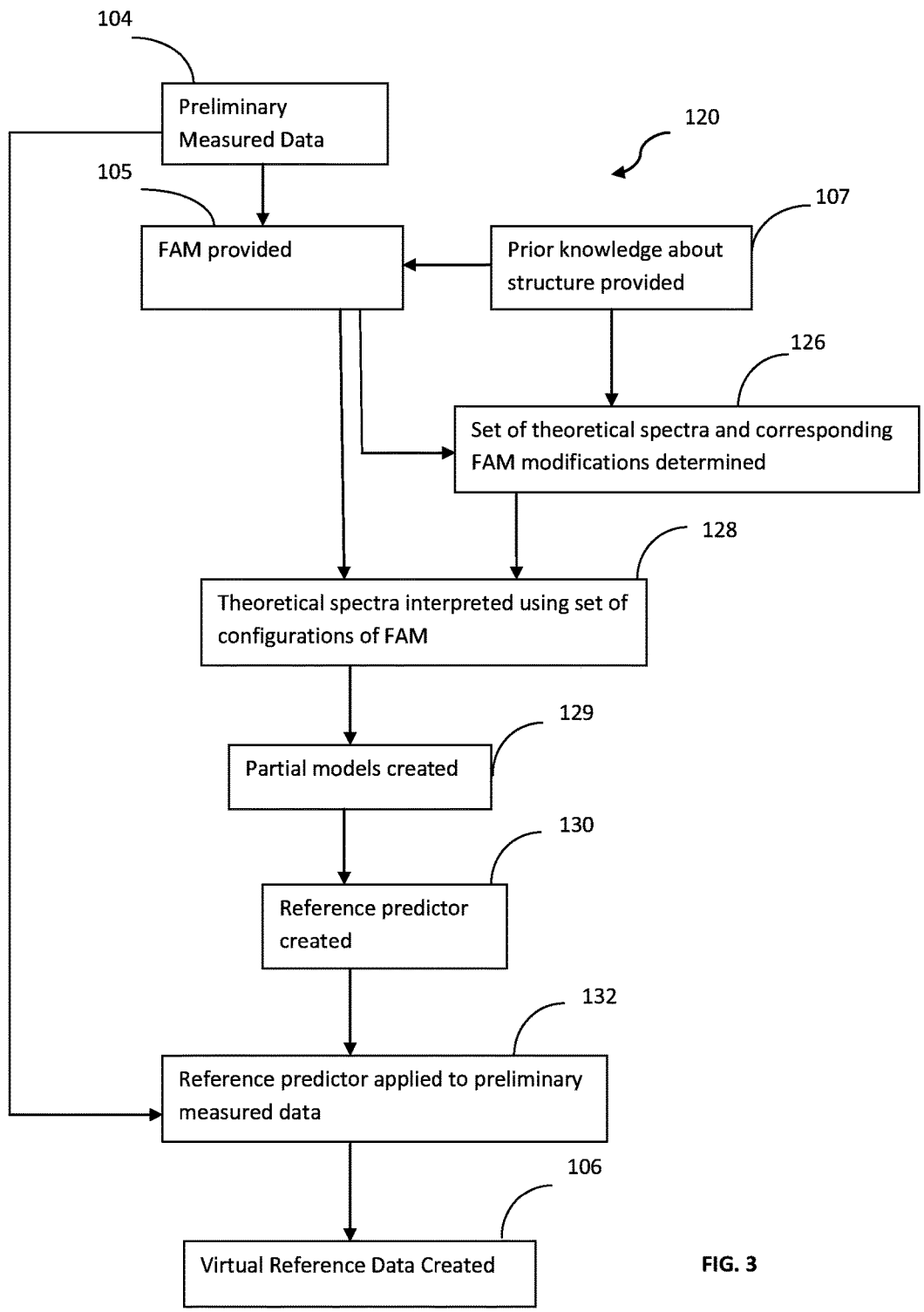
FIG. 3 is an example of the method of the invention for determination of the virtual reference data.

Reference is made to FIG. 3 exemplifying a flow chart 120 of a method of the invention for creation of the virtual reference data (step 106 in FIG. 2).

As shown in the figure, the complete optical model FAM is provided (step 105), being created as described above utilizing the preliminary measured data and possibly also apriori knowledge of the structure. As indicated above, the complete optical model is designed to be flexible enough (has sufficient number of floating parameters), and that can be varied, combined, etc. Thus, the complete optical model is a flexible and adaptive model (FAM), having various configurations/modifications where the possible configurations (permutations) of the model parameters (could) include the description of the "real" structure being measured. Such flexible and adaptive model includes all or most of the parameters of the structure affecting the optical response, while all, or most, of the model parameters are floating.

The input data indicative of the apriori knowledge about the structure is used (processed/analyzed) for generating a set of theoretical optical responses (theoretical spectra) corresponding to different known configurations of the FAM (step 126). More specifically, the prior knowledge about the structure actually includes values of a few structure parameters, e.g. pattern parameters. These known structure parameters are used for generating the known configurations of the FAM and the corresponding theoretical spectra. It should be understood that the theoretical optical response is a so-called "theoretical reference", formed by theoretical spectra from known geometries. Each theoretical response is calculated from a specific geometry configuration, thus defining the known configuration of the corresponding FAM.

The set of theoretical optical responses (spectra) is interpreted (step 128) using a set of different configurations of the complete optical model FAM, and a set of partial models is created (step 129). The partial models are combined and a reference predictor (a so-called "super-recipe") is created (step 130). The reference predictor is applied to the preliminary optical measured data (step 132) and the virtual reference data is created (step 106).

The creation of the reference predictor (step 129) may comprise interpreting each element of the theoretical optical responses (corresponding to the known "real" geometries) by each of the partial models, and selecting a combination of the partial models that best interpret the set of theoretical optical responses according to certain criteria for goodness of interpretation. Then, the selected combination of the partial models is used to create the reference predictor (using at least one statistical tool). For example, several model modifications chosen as described above can be combined using weighting coefficients. The interpretation process may include selection of one configuration that has highest correlation to the "known" values. Subsequently, another configuration is selected that has both low correlation to the first selected configuration and high correlation to the "known" data, and this step in repeated, i.e. a further configuration is selected having low correlation to the first two configurations and high correlation to the "known" data.

The super-recipe is applied to the preliminary measured spectra (step 132). As described above, the "super-recipe" gives the best result according to the constraints imposed, and it can be used to interpret the measured spectra. The result of this interpretation provides the "predicted reference" or "virtual reference" (step 106).

Figure 4:
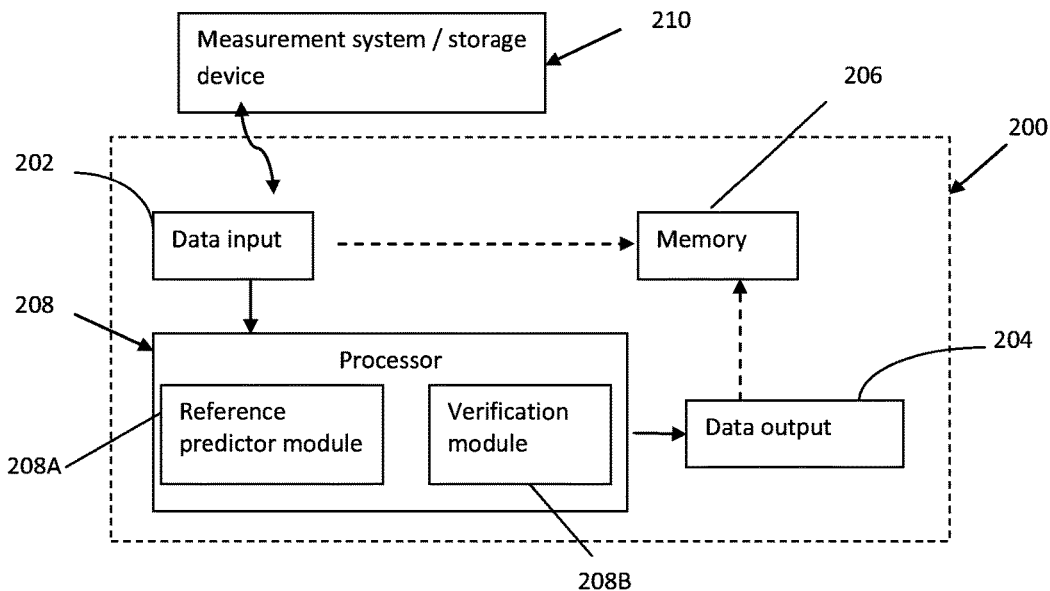
FIG. 4 is a block diagram of the system of the invention for use in model-based measurements.

Reference is made to FIG. 4 showing a block diagram of the system 200 of the invention for use in model-based measurements in patterned structures. The system 200 is typically a computer system including, inter-alia, such functional modules (software/hardware utilities) as data input and output utilities 202 and 204, memory utility 206, and a data processor and analyzer 208. The processor and analyzers 208 includes a reference predictor module 208A and a verification module 208B. The reference predictor module 208A is adapted for carryout the above technique of utilizing input data indicative of the preliminary measured data and apriori knowledge of the structure and creating virtual reference data indicative of the virtual optical response of the structure (virtual reference data). The verification module 208B is adapted for verifying the preliminary measured data with respect to the virtual reference data, and determining the optimal optical model for interpretation of the optical measured data.

The system 200 is associated with/connectable (e.g. via communication network) to an external system 210, which may be a measurement unit and/or a storage device, to receive the above-described input data. For example, the model selection system 200 of the invention may be integral with the measurement system.

Figure 5:
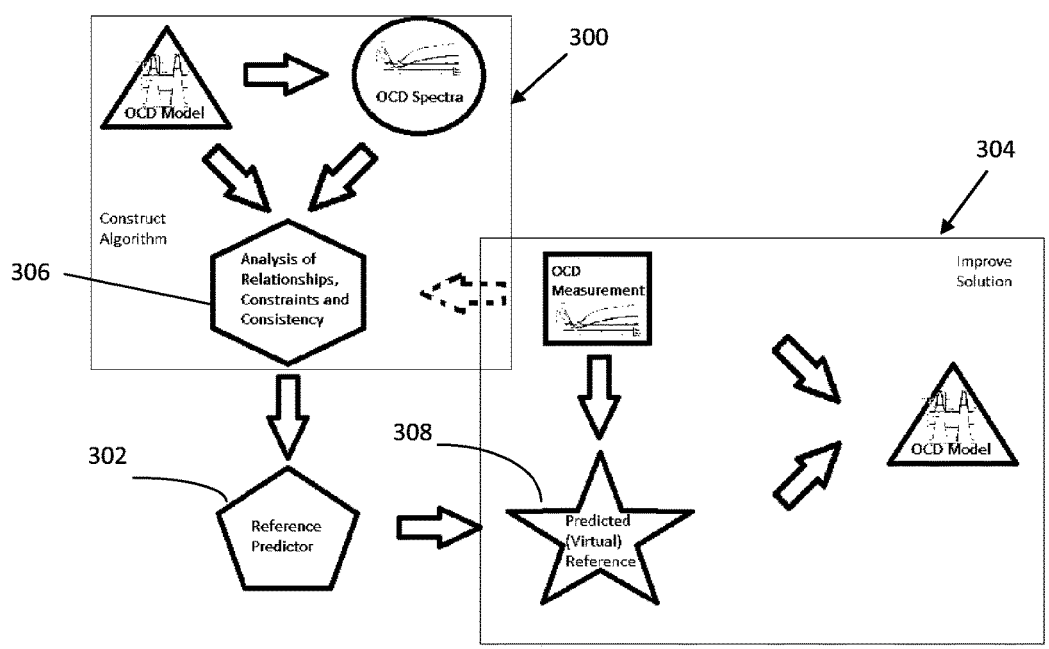
FIG. 5 more specifically illustrates how the technique of the invention can be used in OCD measurements.

Reference is made to FIG. 5 exemplifying a flow chart of the method according to the invention, where the predicted reference (obtained above) is used together with the existing TMU algorithms in order to fine-tune a single recipe that can provide good results. This single recipe can be installed and run in real-time on a control system associated with a measurement tool.

As shown in the figure, the prediction algorithm is performed as described above to construct the complete optical model (step 300), which is then applied to OCD measured data in the manner described above to create a reference predictor (step 302). The reference predictor is used as described above for improving the model selection solution (step 304).

As described above and illustrated in the figure in a self-explanatory manner, the construction of the prediction algorithm is performed by using the flexible and adaptive OCD model to select a set of theoretical OCD spectra, and interpreting these spectra using modifications of the OCD model (step 306). The virtual reference is generated by applying the reference predictor to the OCD measured data (step 308), and the virtual reference is then used for optimizing/selecting the OCD model.

The following is a specific but not limiting example of the above-described methods of FIGS. 3 and 5:

A flexible and adaptive model (FAM) in the form of random points in parameter space is generated. Theoretical spectra for these random points are generated, thus creating a synthetic reference spectra using the complete optical model (flexible and adaptive model with floating parameters). Then, multiple models (modifications of FAM) with different fix/float parameter configurations are generated. To this end, full interpretation with every model on the synthetic reference spectra is performed, where fixed parameters are fixed at nominal values during the interpretation. Interpretation results for all spectra are analyzed and the correlations between the expected target parameter values and the interpretation result of each model are calculated. The FAM modification corresponding to the configuration with the highest correlation is selected. Further additional configuration that is as much un-correlated with previously selected configuration is selected. Consequently, a plurality of configurations or model modifications are selected, where each next configuration is chosen as mostly un-correlated with the previous, but mostly correlated with the complete model. More specifically, as described above, the configuration with highest correlation to "truth" (known values) is selected. Subsequently, the next configuration is selected according to the criterion "highest correlation" to "truth" but "lowest correlation" to the first configuration selected. This is performed in order to span the configuration space most effectively. This process could be performed several times consequently. Further, combined or "super-recipe" is created by combining the selected configurations. This combined recipe is further used to interpret measured spectra. The result of this interpretation represents the "predicted reference".

As indicated above, the inventors have found that the technique of the invention utilizing "predicted (virtual) reference" provides the measured data analysis similar to, and in some cases even slightly better that, those obtainable using real reference data. The technique of the present invention provides for independent usage of scatterometry without waiting for complex recipe validation. Scatterometry development without "real" reference (i.e. reference measurement tool) provides significant time-to-solution improvement and cost savings for those using the best practice of third-party reference validation. The methodology of the invention can be useful even when scatterometry deployment does not include expensive external referencing, as it provides a virtual set of data that represents the structure measured and helps increase the robustness of the solution.

The invention claimed is:

1. A method for use in model-based optical measurements in patterned structures, the method being carried out by a computer system comprising a non-transitory computer readable memory and a data processor: the method comprising:

receiving and storing input data comprising information about a patterned structure configuration;

in response to said receiving of the input data, processing and analyzing the input data, by said data processor, thereby generating a selected optical model for interpretation of optical measured data indicative of optical response of the patterned structure configuration, said processing and analyzing comprising based on the information about the patterned structure configuration, creating a complete optical model including parameters describing the patterned structure configuration, where a majority of the parameters are floating parameters, and defining multiple model configurations describing an optical response of the patterned structure configuration, each of the multiple model configurations created by fixing values of one or more of the parameters, based on the complete model, generating synthetic spectra of the patterned structure configuration, applying a fitting procedure to the synthetic spectra and said multiple model configurations, creating a reference predictor from a subset of the multiple model configurations that meet predefined best-fit criteria, optically measuring a patterned structure on a semiconductor device to produce preliminary measured data, applying said reference predictor to the preliminary measured data to generate corresponding virtual reference data, and selecting at least one of the multiple model configurations corresponding to a highest correlation to the virtual reference data among the multiple model configurations; and providing, for process control during manufacturing of semiconductor devices, the selected model for interpretation of optical measured data of one or more parameters of corresponding patterned structures on the semiconductor devices.

2. The method of claim 1, wherein said selection of the optical model further comprises Total Measurement Uncertainty (TMU) analysis.

3. The method according to claim 1, wherein the creation of the reference predictor comprises:

interpreting theoretical optical responses corresponding to different combinations of said model configurations;

selecting a combination of the model configurations that best interprets the theoretical optical responses according to predetermined criteria; and utilizing the selected combination of the model configurations to create the reference predictor.

4. The method according to claim 3, comprising applying at least one statistical tool to the selected combination of the model configurations for creation of the reference predictor.

5. The method according to claim 3, wherein the creation of the reference predictor from the model configurations comprises spanning a model configuration space by performing at least one selection session, the selection session comprising: selecting a preceding model configuration having highest correlation to the theoretical optical response, subsequently selecting a successive model configuration having highest correlation to the theoretical optical response and lowest correlation to the preceding model configuration.

6. The method according to claim 1, wherein said floating parameters defining the multiple model configurations include at least some of the following parameters of a pattern in the structure: critical dimensions (CD), top CD, bottom CD, sidewall angle, spacer widths, spacer pull-down, epitaxial proximity, footing/undercut, overfill/underfill parameters, rounding.

7. The method according to claim 1, wherein at least some of said floating parameters defining the multiple model configurations are parameters of interest in the corresponding patterned structures being measured.

8. A system for carrying out the method of claim 1, the system being configured as a computer comprising: a data input utility configured and operable to receive the input data comprising apriori knowledge about one or more parameters of the patterned structure configuration; a non-transitory computer readable memory for storing the input data; and a processor utility comprising; a reference predictor module adapted for utilizing said preliminary measured data and said apriori knowledge and creating the virtual reference data; and a verification module for verifying the preliminary measured data with respect to the virtual reference data, and determining and storing the selected optical model for interpretation of the optical measured data.

* * * * *